(12) United States Patent
Wang et al.

(10) Patent No.: US 10,709,012 B2
(45) Date of Patent: Jul. 7, 2020

(54) HIGH-FREQUENCY ELECTRONIC DEVICE AND MANUFACTURING METHOD THEREOF

(71) Applicant: Innolux Corporation, Miao-Li County (TW)

(72) Inventors: Yan-Syun Wang, Miao-Li County (TW); Chi-Che Tsai, Miao-Li County (TW); Wei-Yen Wu, Miao-Li County (TW); I-Yin Li, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 39 days.

(21) Appl. No.: 15/858,004

(22) Filed: Dec. 29, 2017

(65) Prior Publication Data
US 2018/0206329 A1   Jul. 19, 2018

Related U.S. Application Data

(60) Provisional application No. 62/446,581, filed on Jan. 16, 2017.

(30) Foreign Application Priority Data

Apr. 27, 2017   (CN) .......................... 2017 1 0286875

(51) Int. Cl.
*H05K 1/02*        (2006.01)
*H05K 3/10*        (2006.01)
(Continued)

(52) U.S. Cl.
CPC .............. *H05K 1/024* (2013.01); *H01P 3/08* (2013.01); *H05K 1/0296* (2013.01); *H05K 3/10* (2013.01);
(Continued)

(58) Field of Classification Search
CPC ......... H01P 3/00–006; H01P 3/08–088; H05K 1/024; H05K 3/10
See application file for complete search history.

(56) References Cited

U.S. PATENT DOCUMENTS 7,852,169 B2 * 12/2010 Dutta .................. H01L 23/5383
                                                    333/1
2005/0237137 A1   10/2005 Dutta et al.

FOREIGN PATENT DOCUMENTS

CN        104377415 A   *  2/2015
CN        104377415 A      2/2015

OTHER PUBLICATIONS

CN Office Action dated Jul. 30, 2019 by China National Intellectual Property Administration, Application # 201710286875.6, pp. 1-10.

* cited by examiner

*Primary Examiner* — Dean O Takaoka
*Assistant Examiner* — Alan Wong
(74) *Attorney, Agent, or Firm* — McClure, Qualey & Rodack, LLP (57) ABSTRACT

A high-frequency electronic device including a dielectric substrate, a first patterned metal layer and a second patterned metal layer is provided. The dielectric substrate has a first region and a second region. The first patterned metal layer is disposed on a first side of the dielectric substrate and corresponds to the first region, wherein the first region and the second region have different etching rates with respect to an etching solution. The second patterned metal layer is disposed on the first side or a second side opposite to the first side of the dielectric substrate.

18 Claims, 8 Drawing Sheets

(51) Int. Cl.
*H01P 3/08* (2006.01)
*H05K 3/22* (2006.01)
(52) U.S. Cl.
CPC ............ *H05K 3/22* (2013.01); *H05K 1/0219* (2013.01); *H05K 2201/0187* (2013.01); *H05K 2201/09336* (2013.01); *H05K 2203/107* (2013.01)

HIGH-FREQUENCY ELECTRONIC DEVICE AND MANUFACTURING METHOD THEREOF

This application claims the benefit of U.S. provisional application Ser. No. 62/446,581, filed Jan. 16, 2017 and People's Republic of China application Serial No. 201710286875.6, filed Apr. 27, 2017, the subject matters of which are incorporated herein by references.

TECHNICAL FIELD

The disclosure relates in general to an electronic device, and more particularly to a high-frequency electronic device.

BACKGROUND

In recent years, the application of high-frequency electronic device has gained great popularity. However, due to the special features of high-frequency operation, how to reduce the manufacturing cost and at the same time reduce the decay of electromagnetic wave during the propagating process has become a prominent task for the industries.

SUMMARY

The disclosure is directed to a high-frequency electronic device. Through the design disclosed in the embodiments of the present disclosure, the dielectric substrate has a lower loss tangent in a first region corresponding to a first patterned metal layer, such that the decay rate of electromagnetic wave during the propagating process is smaller in the first region.

According to one embodiment of the present disclosure, a high-frequency electronic device is provided. The high-frequency electronic device includes a dielectric substrate, a first patterned metal layer and a second patterned metal layer. The dielectric substrate has a first side, a second side opposite to the first side, a first region, and a second region adjacent to the first region, wherein the first region and the second region have different etching rates with respect to an etching solution. The first patterned metal layer is disposed on the first side of the dielectric substrate and corresponds to the first region. The second patterned metal layer is disposed on the first side of the dielectric substrate or the second side.

According to another embodiment of the present disclosure, a manufacturing method of high-frequency electronic device is provided. The manufacturing method of high-frequency electronic device includes following steps: A dielectric substrate is provided. A laser is applied to a first region of the dielectric substrate but not a second region adjacent to the first region of the dielectric substrate, wherein the first region and the second region have different etching rates with respect to an etching solution. A first patterned metal layer is formed on a first side of the dielectric substrate and corresponds to the first region. A second patterned metal layer is formed on the first side or a second side opposite to the first side of the dielectric substrate.

The above and other aspects of the invention will become better understood with regard to the following detailed description of the preferred but non-limiting embodiment(s). The following description is made with reference to the accompanying drawings.

DETAILED DESCRIPTION

A number of embodiments of the present disclosure are disclosed below with reference to accompanying drawings. Reference numerals common to the accompanying drawings and embodiments are used to indicate identical or similar elements. It should be noted that the drawings are simplified such that the content of the embodiments can be clearly described. In addition, detailed structures disclosed in the embodiments are for explanatory and exemplary purposes only, not for limiting the scope of protection of the present disclosure. Although the present disclosure does not illustrate all possible embodiments, a person ordinary skilled in the technology field can make necessary modifications or adjustments to fit actual needs without breaching the spirit and scope of the present disclosure.

Figure 1:
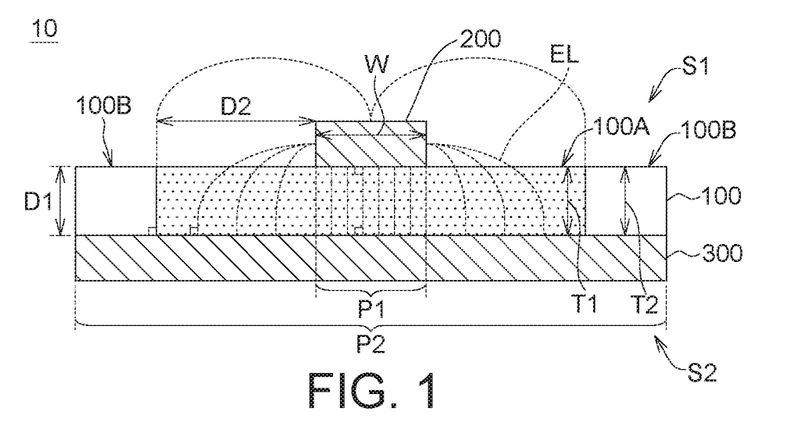
FIG. 1 is a schematic diagram of a high-frequency electronic device according to an embodiment of the present disclosure.

FIG. 1 is a schematic diagram of a high-frequency electronic device according to another embodiment of the present disclosure. As indicated in FIG. 1, the high-frequency electronic device 10 includes a dielectric substrate 100, a first patterned metal layer 200 and a second patterned metal layer 300. The dielectric substrate 100 has a first region 100A, a second region 100B adjacent to the first region 100A, a first side S1, and a second side S2 opposite to the first side S1. The first patterned metal layer 200 is disposed on the first side S1 of the dielectric substrate 100 and corresponds to the first region 100A. The second patterned metal layer 300 is disposed on the second side S2 of the dielectric substrate 100. The first region 100A and the second region 100B have different etching rates with respect to an etching solution. It should be noted that the high-frequency electronic device 10 can be realized by an antenna device such as a liquid crystal antenna or a circuit device capable of transmitting high-frequency signals. The frequency of the high-frequency signal is for example in a range from 1 to 50 GHz, but the present disclosure is not limited thereto. It should be noted that "disposed on" may refer to "indirectly disposed on" or "directly disposed on" if not particularly noted. In the present disclosure, the dielectric substrate 100 is an electrical insulator through which the electromagnetic wave passes during the propagating process.

As indicated in FIG. 1, a first projection P1 of the first patterned metal layer 200 on the dielectric substrate 100 overlaps the first region 100A, and the first projection P1 does not overlap the second region 100B. It should be noted than a projection of an object on a substrate refers to an orthogonal projection of the object on the substrate. It should be noted that "overlap" may refer to "partially overlap" or "completely overlap" if not particularly noted.

In some embodiments, the first region 100A has a first etching rate with respect to an etching solution, the second region 100B has a second etching rate with respect to the etching solution, and the first etching rate is smaller than the second etching rate. In some embodiments, the etching solution is an 8% HF solution. The first etching rate is 1-2 μm/min in an 8% HF solution. The second etching rate is 3-5 μm/min in an 8% HF solution. However, the present disclosure is not limited to the above range of the etching rate.

Based on the embodiments of the present disclosure, the first region 100A of the dielectric substrate 100 having been processed with a suitable treatment (such as a laser treatment) has a higher crystallinity but a lower loss tangent, and the second region 100B of the dielectric substrate 100 not having been processed with any suitable treatments has a lower crystallinity. The first region 100A and the second region 100B have different etching rates with respect to the etching solution because the first region 100A and the second region 100B have different degrees of crystallinity. The loss tangent, which can be denoted by tan δ, refers to the electric energy consumed by a dielectric substance and converting to heat energy per unit volume per unit time. The loss tangent is a physical quantity of the electric energy consumed by a dielectric substance having received an AC electric field.

In some embodiments, the first patterned metal layer 200 and the second patterned metal layer 300 can be realized by transmission lines. As indicated in FIG. 1, the dielectric substrate 100 has a lower loss tangent in the first region 100A on which the first patterned metal layer 200 is disposed, such that the decay rate of electromagnetic wave during the propagating process is smaller in the first region 100A and thus the first region 100A is a suitable medium for high-frequency transmission.

In some embodiments as indicated in FIG. 1, a second projection P2 of the second patterned metal layer 300 on the dielectric substrate 100 overlaps the second region 100B.

In an embodiment as indicated in FIG. 1, the first patterned metal layer 200 and the second patterned metal layer 300 are disposed on two opposite sides of the dielectric substrate 100 and are separated by a first distance D1, wherein the first distance D1 is the shortest distance between the first patterned metal layer 200 and the second patterned metal layer 300 along the normal direction of a surface of the dielectric substrate 100. As indicated in FIG. 1, the second projection P2 of the second patterned metal layer 300 can overlap the first region 100A and the second region 100B at the same time, and the electric field line EL indicates the distribution range of electric field induced by a voltage difference between the first patterned metal layer 200 and the second patterned metal layer 300.

As indicated in FIG. 1, the second patterned metal layer 300 is disposed on the second side S2 of the dielectric substrate 100 and is separated from the first patterned metal layer 200 by the first distance D1, and a lateral side of the first patterned metal layer 200 is separated from a lateral side of the first region 100A by a second distance D2, wherein the second distance D2 is the shortest distance between a lateral side of the first patterned metal layer 200 and a lateral side of the first region 100A along a direction perpendicular to the normal direction of a surface of the dielectric substrate 100. The second distance D2 is, for example, 2 to 6 times the first distance D1 or 2 to 6 times the width W of the first patterned metal layer 200. In another embodiment, the second distance D2 is, for example, 3 to 5 times the first distance D1 or 3 to 5 times the width W of the first patterned metal layer 200. In the embodiment as indicated in FIG. 1, the range of fringe field (the second distance D2) is approximate 2 to 6 or 3 to 5 times the distance between the first patterned metal layer 200 and the second patterned metal layer 300 (the first distance D1) or 2 to 6 or 3 to 5 times the width W of the first patterned metal layer 200.

In some embodiments, the materials of the first patterned metal layer 200 and the second patterned metal layer 300 may include copper, silver, gold, palladium, molybdenum, titanium or indium zinc oxide (IZO), but the present disclosure is not limited thereto.

In some embodiments, the dielectric substrate 100 can be realized by a glass substrate including amorphous silicon oxide. After the first region 100A is processed with a laser treatment, the first region 100A has a higher crystallinity like the quartz, and therefore has a lower loss tangent. Meanwhile, the second region 100B not having been processed with the laser treatment still remains the state of amorphous glass. Based on the embodiments of the present disclosure as indicated in FIG. 1, since the electromagnetic wave is propagating within the distribution range of electric field and the first region 100A having a lower loss tangent substantially covers the distribution range of electric field, the first region 100A is a suitable medium for high-frequency transmission. Moreover, the localized region in the dielectric substrate 100, such as the first region 100A, is processed with the crystallinity treatment for reducing loss tangent, so the manufacturing cost can be reduced. In this disclosure, the dielectric substrate 100 can be a rigid substrate which includes glass, ceramic or quartz. Or, the dielectric substrate 100 can be a flexible substrate which includes polyimide, polycarbonate, polyethylene terephthalate, or the like. The present disclosure it not limited thereto.

In some embodiments, the dielectric substrate 100 can be realized by such as a glass substrate, the etching solution can be realized by an alkaline etching solution includes such as sodium hydroxide, potassium hydroxide or a combination thereof, or an acidic etching solution includes such as hydrofluoric acid, nitric acid, hydrochloric acid, phosphoric acid, oxalic acid, acetic acid or a combination thereof, but the present disclosure is not limited thereto.

FIGS. 1A-4E are schematic diagrams of a high-frequency electronic device according to some embodiments of the present disclosure. For elements the same as or similar to above embodiments, the same or similar reference numerals are used to indicate the same or similar elements, and the similarities are not repeated here.

Figure 1A:
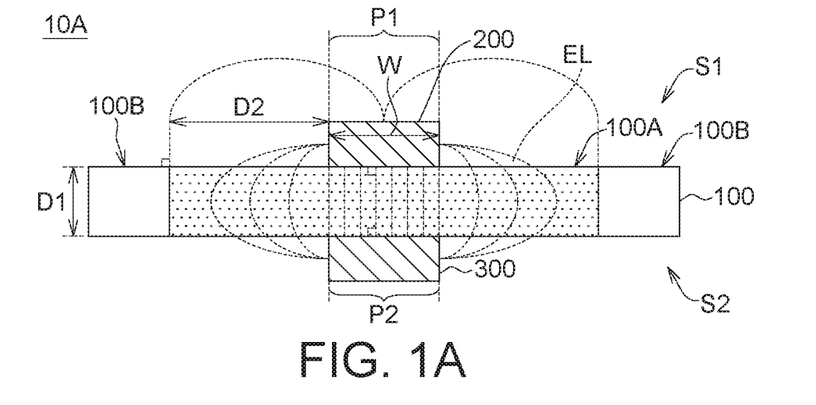
FIG. 1A is a schematic diagram of a high-frequency electronic device according to another embodiment of the present disclosure.

In an embodiment of the high-frequency electronic device 10A as indicated in FIG. 1A, the second projection P2 of the second patterned metal layer 300 on the dielectric substrate 100 overlaps the first region 100A.

In some embodiments as indicated in FIG. 1A, the first patterned metal layer 200, the second patterned metal layer 300 and the dielectric substrate 100 can be realized by such as capacitors, the width W of the first patterned metal layer 200 is substantially equivalent to the width of the second patterned metal layer 300, and the second projection P2 of the second patterned metal layer 300 does not overlap the second region 100B of the dielectric substrate 100.

Figure 2:
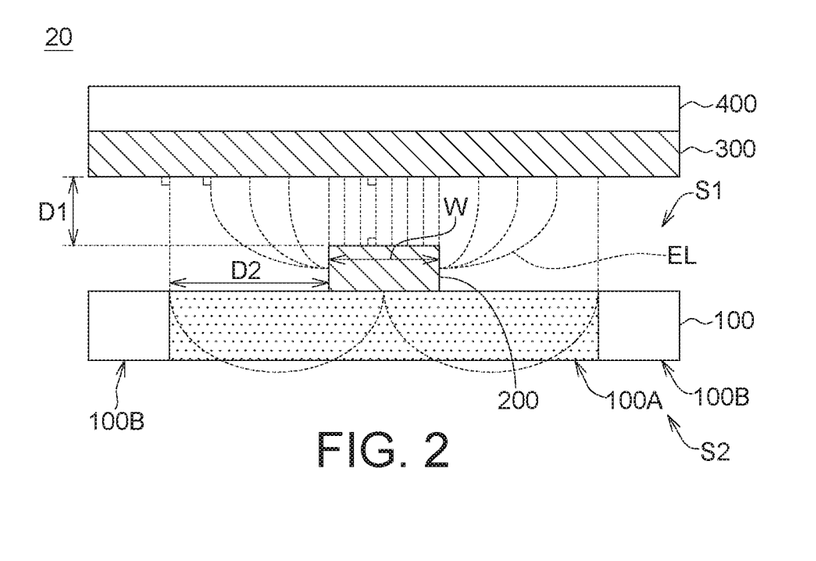
FIG. 2 is a schematic diagram of a high-frequency electronic device according to of the present disclosure an alternate embodiment.

FIG. 2 is a schematic diagram of a high-frequency electronic device according to an alternate embodiment of the present disclosure, the high-frequency electronic device 20 further includes a substrate 400, wherein the second patterned metal layer 300 is disposed on the first side S1 of the dielectric substrate 100. In other words, the second patterned metal layer 300 is disposed on a side of the substrate 400 which faces the first side S1 of the dielectric substrate 100. In an embodiment, the substrate 400 can be realized by such as a glass substrate.

In an embodiment as indicated in FIG. 2, the first patterned metal layer 200 is interposed between the second patterned metal layer 300 and the dielectric substrate 100 and is separated from the second patterned metal layer 300 by a first distance D1, wherein the first distance D1 is the shortest distance between the first patterned metal layer 200 and the second patterned metal layer 300 along the normal direction of a surface of the dielectric substrate 100. A lateral side of the first patterned metal layer 200 is separated from a lateral side of the first region 100A by a second distance D2, wherein the second distance D2 is the shortest distance between a lateral side of the first patterned metal layer 200 and a lateral side of the first region 100A along a direction perpendicular to the normal direction of a surface of the dielectric substrate 100, and the second distance D2 is 2 to 6 or 3 to 5 times the first distance D1 or 2 to 6 or 3 to 5 times the width W of the first patterned metal layer 200.

Figure 3:
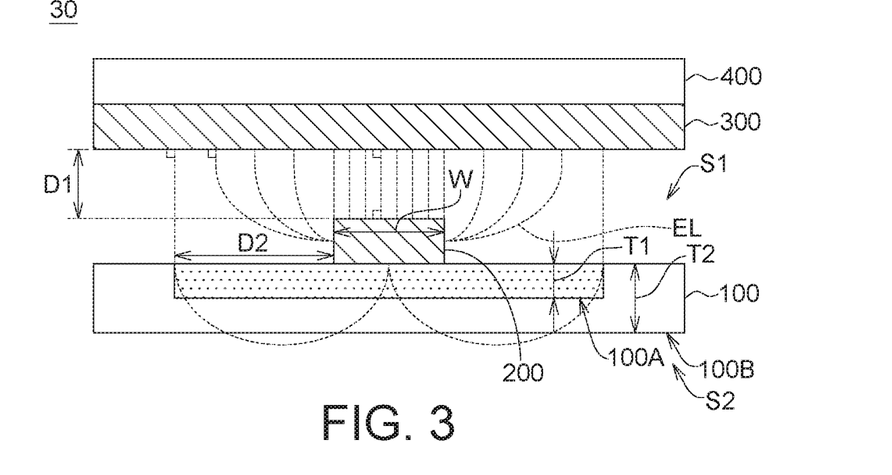
FIG. 3 is a schematic diagram of a high-frequency electronic device according to of the present disclosure another alternate embodiment.

FIG. 3 is a schematic diagram of a high-frequency electronic device according to of the present disclosure another alternate embodiment. The thickness T1 of the first region 100A of the dielectric substrate 100 is smaller than the thickness T2 of the dielectric substrate 100. In an embodiment, the thickness T1 can be larger than or equal to 10 micrometers (μm). In some other embodiments of the high-frequency electronic device 10 as indicated in FIG. 1, the thickness T1 of the first region 100A of the dielectric substrate 100 is equal to the thickness T2 of the dielectric substrate 100.

Figure 4A:
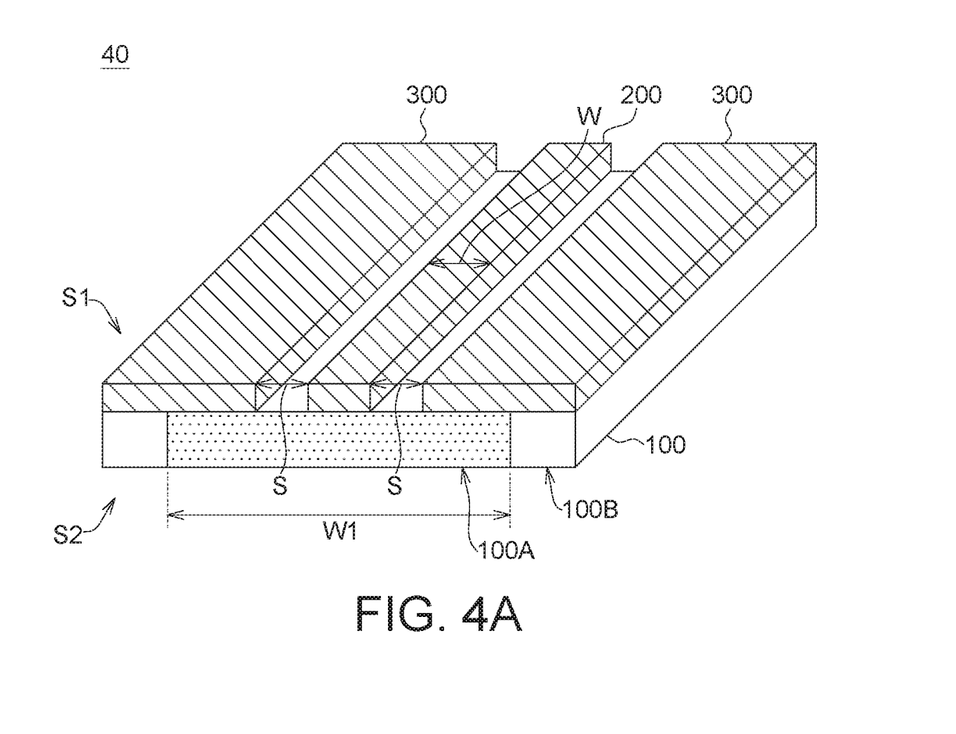
FIG. 4A is a 3D diagram of a high-frequency electronic device according to an embodiment of the present disclosure.
Figure 4B:
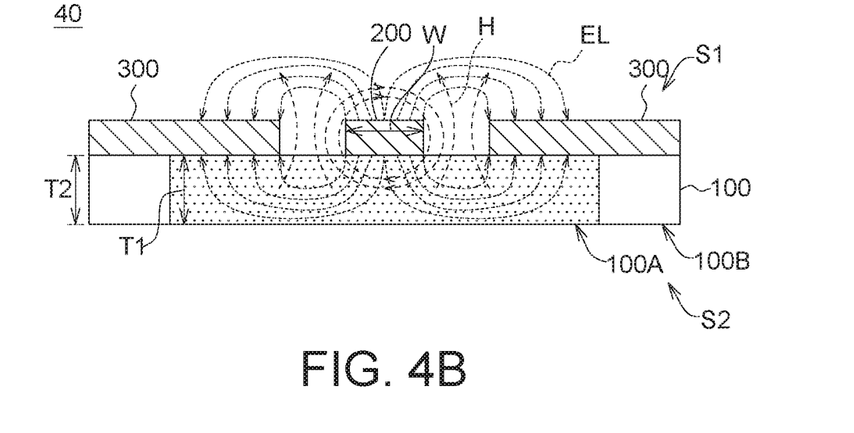
FIG. 4B is a cross-sectional view of the high-frequency electronic device FIG. 4A.

FIG. 4A is a 3D diagram of a high-frequency electronic device according to an embodiment of the present disclosure. FIG. 4B is a cross-sectional view of the high-frequency electronic device FIG. 4A. As indicated in the high-frequency electronic device 40 of FIGS. 4A-4B, the first patterned metal layer 200 and the second patterned metal layer 300 are co-planar (that is, the first patterned metal layer 200 and the second patterned metal layer 300 both are disposed on the first side S1 of the dielectric substrate 100) and are separated by an interval S. In more details, the second patterned metal layer 300 comprises two separated parts, the first patterned metal layer 200 is disposed between the two separated parts, and a shortest distance between a lateral side of one separated part and a lateral side of the first patterned metal layer 200 along a direction perpendicular to the normal direction of a surface of the dielectric substrate is defined as the interval S. The first patterned metal layer 200 has a width W, and the first region 100A of the dielectric substrate 100 has a width W1, wherein W1 is in a range from 2W+2S to 13W+2S. In another embodiment, W1 is in a range from 5W+2S to 11W+2S.

In some embodiments, the first patterned metal layer 200 and the second patterned metal layer 300 can be realized by such as coplanar waveguide, the distributions of magnetic field line H and electric field line EL are indicated in FIG. 4B, and the coverage of the electric field line EL indicates the distribution of electric field. As indicated in FIG. 4B, the dielectric substrate 100 has a lower loss tangent in the first region 100A on which the first patterned metal layer 200 is disposed, such that the decay rate of electromagnetic wave during the propagating process is smaller in the first region 100A and thus the first region 100A is a suitable medium for high-frequency transmission.

Figure 4C:
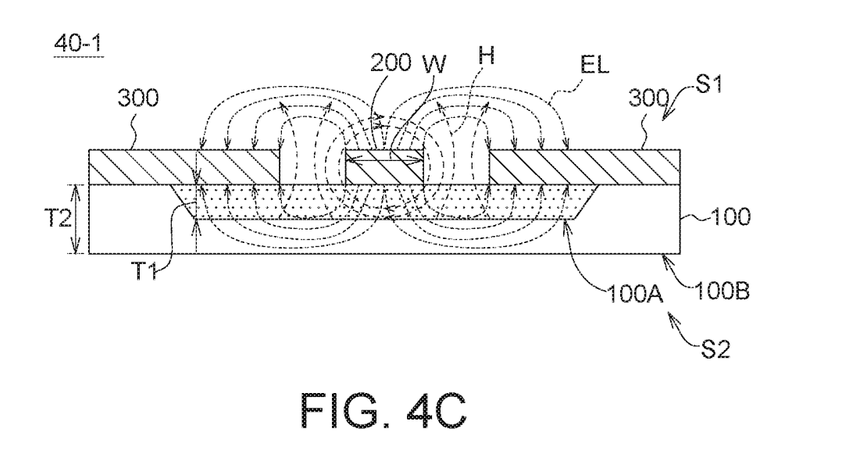
FIG. 4C-FIG. 4E are cross-sectional view of a high-frequency electronic device according to some embodiments of the present disclosure.
Figure 4D:
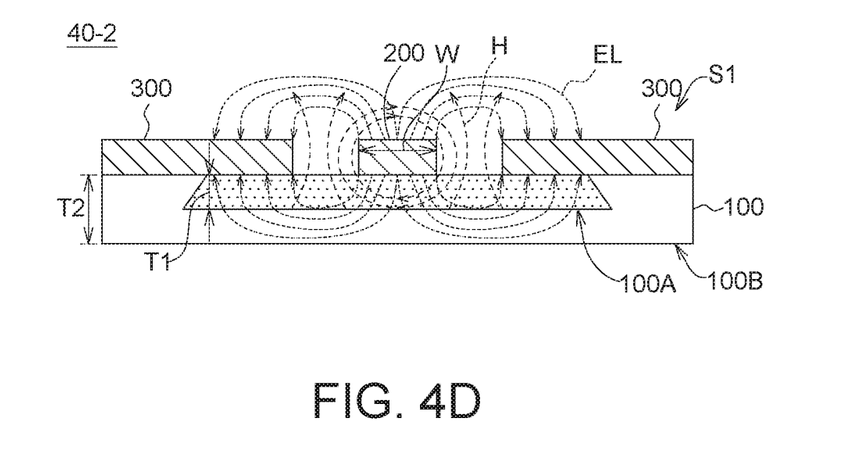
Figure 4E:
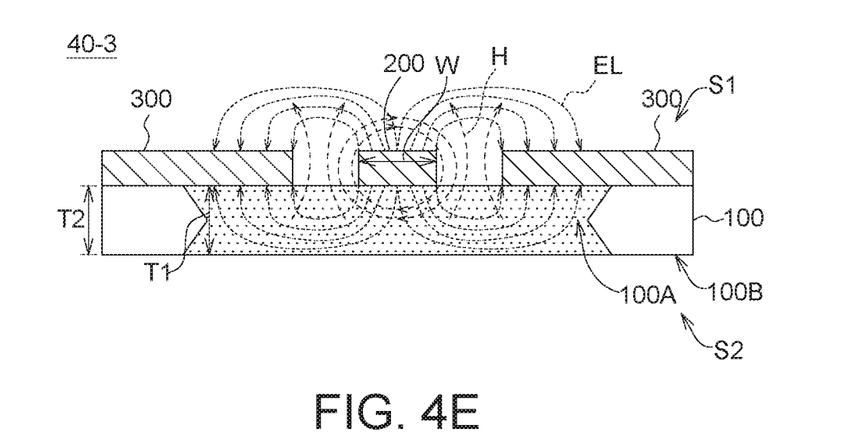

FIGS. 4C-4E are cross-sectional views of a high-frequency electronic device according to some embodiments of the present disclosure. In some embodiments, the cross-sectional shape of the first region 100A of the dielectric substrate 100 can be a square or a trapezoid. As indicated in the high-frequency electronic device 40 of FIG. 4A-4B, the cross-sectional shape of the first region 100A is a square.

As indicated in the high-frequency electronic device 40-1 of FIG. 4C, the first side S1 (on which the first patterned metal layer 200 is disposed) faces upward, the cross-sectional shape of the first region 100A of the dielectric substrate 100 can be a trapezoid, and the length of the bottom edge is smaller than the length of the top edge.

As indicated in the high-frequency electronic device 40-2 of FIG. 4D, the first side S1 (on which the first patterned metal layer 200 is disposed) faces upwards, the cross-sectional shape of the first region 100A of the dielectric substrate 100 can be a trapezoid, and the length of the bottom edge is larger than the length of the top edge.

As indicated in the high-frequency electronic device 40-3 of FIG. 4E, the first side S1 (on which the first patterned metal layer 200 is disposed) faces upwards, and the cross-sectional shape of the first region 100A of the dielectric substrate 100 is formed of two trapezoids. Of the trapezoid closer to the first side S1, the length of the bottom edge is smaller than the length of the top edge. Of the trapezoid farther away from the first side S1, the length of the bottom edge is larger than the length of the top edge.

FIGS. 5A-5D are manufacturing processes of a manufacturing method of high-frequency electronic device according to an embodiment of the present disclosure. For elements the same as or similar to above embodiments, the same or similar reference numerals are used to indicate the same or similar elements, and the similarities are not repeated here.

Figure 5A:
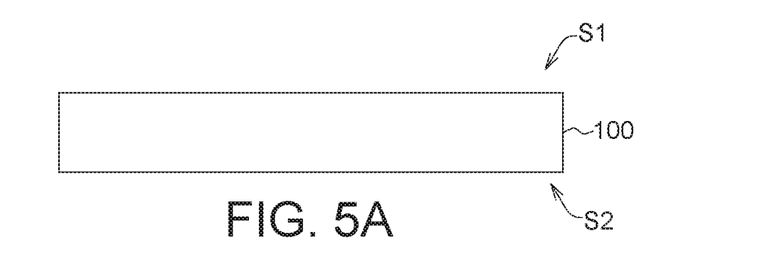
FIG. 5A-FIG. 5D are manufacturing processes of a manufacturing method of high-frequency electronic device according to an embodiment of the present disclosure.

As indicated in FIG. 5A, a dielectric substrate 100 is provided.

Figure 5B:
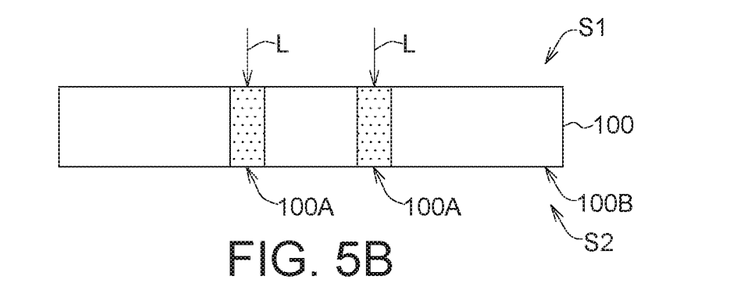

As indicated in FIG. 5B, a laser L is applied on a first region 100A of the dielectric substrate 100 but not a second region 100B adjacent to the first region 100A. Since the first region 100A has better crystallinity, the first region 100A having been processed with a laser treatment and the second region 100B not having been processed with a laser treatment have different etching rates with respect to an etching solution.

In some embodiments, the laser can be a continuous wave laser or a pulsed laser.

In an embodiment, the conditions of the continuous wave laser are illustrated in Table 1.

TABLE 1

| Range of wavelength | 500-1200 nanometers (nm) |
|---|---|
| Repetition rate | 200-500 kHz |
| Pulse energy | 0.2-2.6 μJ |

In an embodiment, the conditions of the pulsed laser are illustrated in Table 2.

TABLE 2

| Range of wavelength | 500-1200 nanometers (nm) |
|---|---|
| Pulse duration | nanosecond-femtosecond |

TABLE 2-continued

| Repetition rate | 200-500 kHz |
|---|---|
| Pulse energy | 0.2-2.6 µJ |

In an embodiment as indicated in FIG. 5B, the first region 100A has a cross-sectional width of 50 nm-1 µm and a thickness of 250-500 µm, and the thickness of the first region 100A is substantially equal to the thickness of the dielectric substrate 100. As indicated in FIG. 5B, two first regions 100A are separated by approximately 100 µm.

Figure 5C:
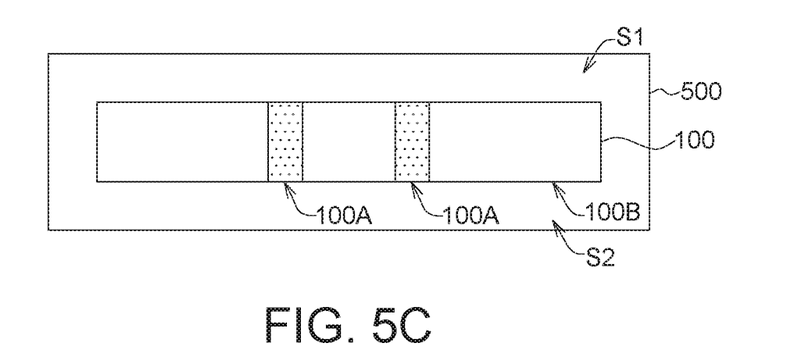

As indicated in FIG. 5C, the first region 100A of the dielectric substrate 100 can be selectively processed with a heat treatment at a temperature of 600-800° C. by using a furnace 500 such as an electric furnace or a high-temperature furnace. The heat treatment can further increase the crystallinity of the first region 100A.

According to other practice, the crystallization of the amorphous glass normally requires a heat treatment using a high-temperature furnace at a temperature above 1000° C. Based on the embodiments of the present disclosure, the laser treatment can increase crystallinity in a localized first region 100A. When the crystallinity of the first region 100A is selectively further increased by way of heat treatment, a heat treatment using a high-temperature furnace at a temperature of 600-800° C. would suffice to increase the crystallinity. Therefore, the manufacturing cost can be reduced and the manufacturing process can be simplified.

Figure 5D:
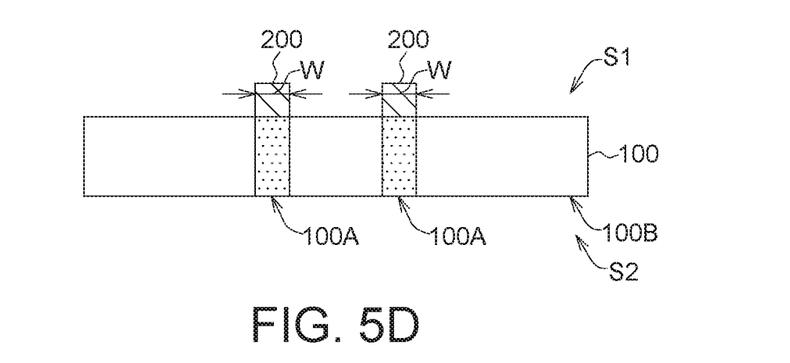

As indicated in FIG. 5D, a first patterned metal layer 200 is formed on the first side S1 of the dielectric substrate 100 and corresponds to the first region 100A. In an embodiment as indicated in FIG. 5D, the first patterned metal layer 200 can include copper and the width W of the first patterned metal layer 200 is equal to or smaller than the width of the first region 100A of the dielectric substrate 100.

Then, a second patterned metal layer 300 is formed on the first side S1 or the second side S2 of the dielectric substrate 100 with reference to the drawings of previous embodiments.

FIGS. 6A-6B and FIGS. 7A-7B are manufacturing processes of a manufacturing method of high-frequency electronic device according to some embodiments of the present disclosure. For elements the same as or similar to above embodiments, the same or similar reference numerals are used to indicate the same or similar elements, and the similarities are not repeated here.

Figure 6A:
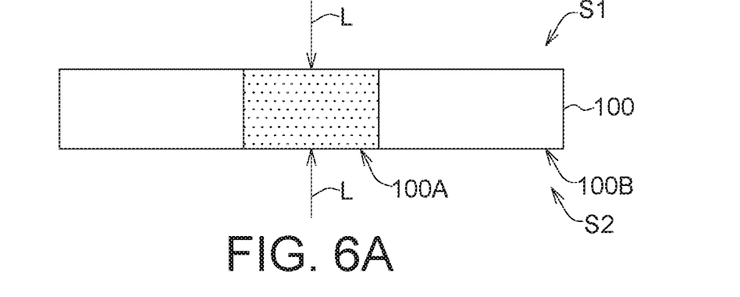
FIGS. 6A-FIG. 6B and FIGS. 7A-FIG. 7B are manufacturing processes of a manufacturing method of high-frequency electronic device according to some embodiments of the present disclosure.
Figure 6B:
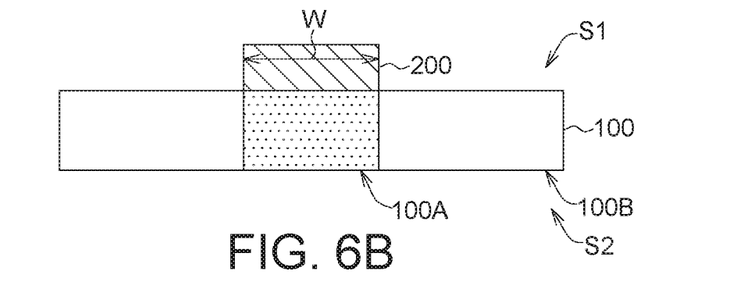

As indicated in FIG. 6A-FIG. 6B, when the step of forming the first patterned metal layer 200 and/or the second patterned metal layer 300 is performed after the step of applying a laser L on the dielectric substrate 100, the laser L can be applied to both sides of the dielectric substrate 100. As indicated in FIG. 6A-FIG. 6B, after the first region 100A is formed, an element (such as the first patterned metal layer 200) is formed on the first region 100A.

Figure 7A:
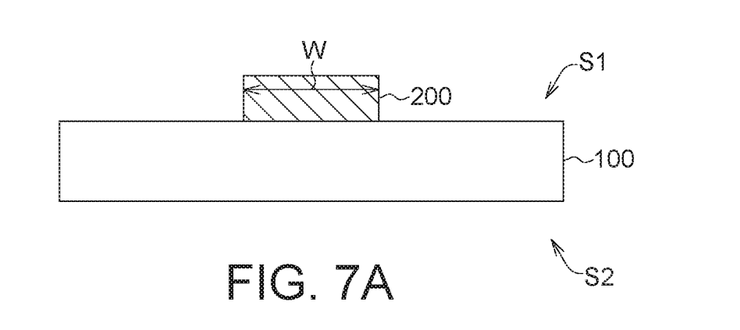
Figure 7B:
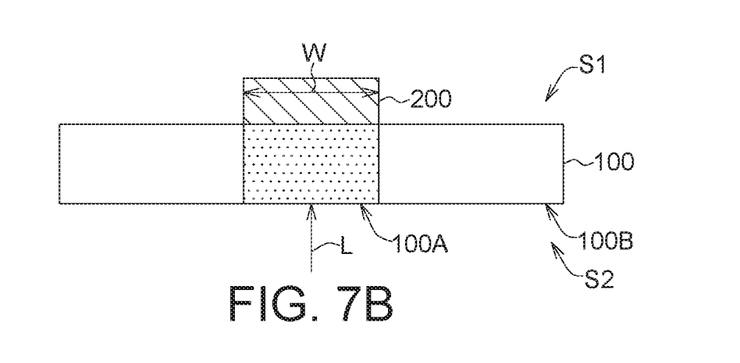

As indicated in FIG. 7A-FIG. 7B, when the step of applying a laser L on the dielectric substrate 100 is performed after the step of forming an element (such as the first patterned metal layer 200 and/or the second patterned metal layer 300) is completed, the laser L needs to be applied to the side of the dielectric substrate 100 opposite to the side of the dielectric substrate 100 on which the element is formed. As indicated in FIG. 7A-FIG. 7B, after an element (the first patterned metal layer 200) is formed on the dielectric substrate 100, the first region 100A is formed on a position corresponding to the first patterned metal layer 200.

FIGS. 8A-8G are examples of a dielectric substrate manufactured using a manufacturing method according to some embodiments of the present disclosure. For elements the same as or similar to above embodiments, the same or similar reference numerals are used to indicate the same or similar elements, and the similarities are not repeated here.

Figure 8A:
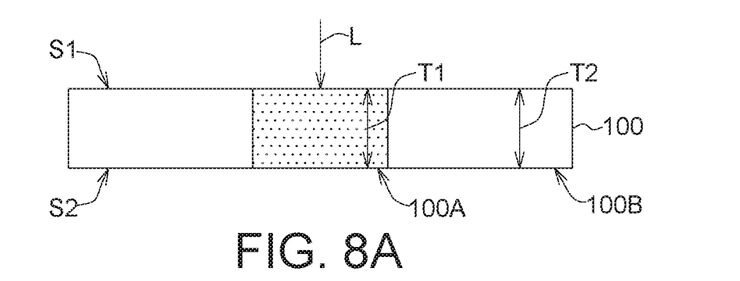
FIGS. 8A-8G are examples of a dielectric substrate manufactured using a manufacturing method according to some embodiments of the present disclosure.
Figure 8B:
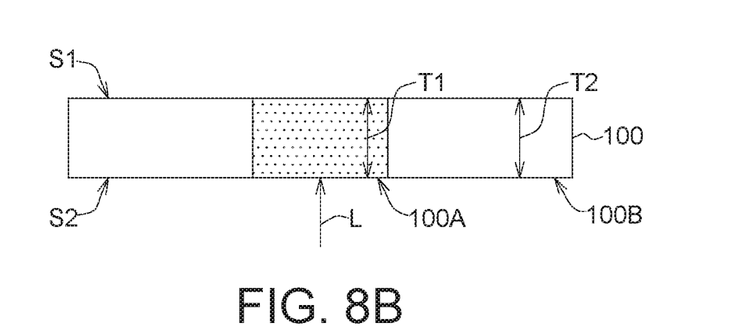

As indicated in FIG. 8A-FIG. 8B, when the thickness T1 of the first region 100A of the dielectric substrate 100 is set to be equal to the thickness T2 of the dielectric substrate 100 and the cross-sectional shape of the first region 100A is set to be a square, during the formation of the first region 100A, the laser L can be applied from either the first side S1 or the second side S2 of the dielectric substrate 100.

Figure 8C:
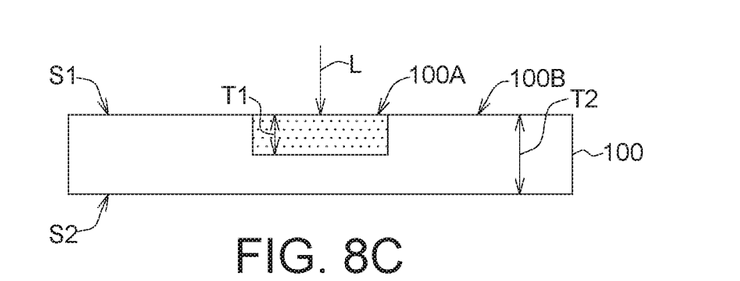
Figure 8D:
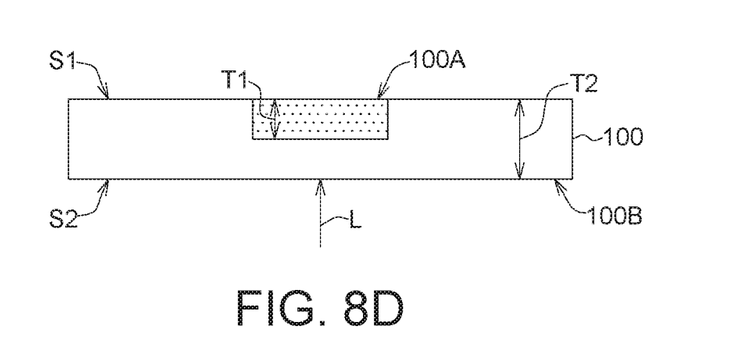

As indicated in FIG. 8C-FIG. 8D, when the thickness T1 of the first region 100A of the dielectric substrate 100 is set to be smaller than the thickness T2 of the dielectric substrate 100 and the cross-sectional shape of the first region 100A is set to be a square, during the formation of the first region 100A, the laser L can be applied from either the first side S1 or the second side S2 of the dielectric substrate 100. For example, a confocal laser is applied from the second side S2 to form the first region 100A.

Figure 8E:
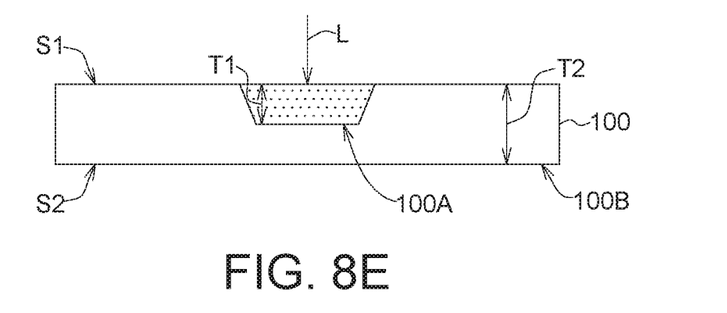
Figure 8F:
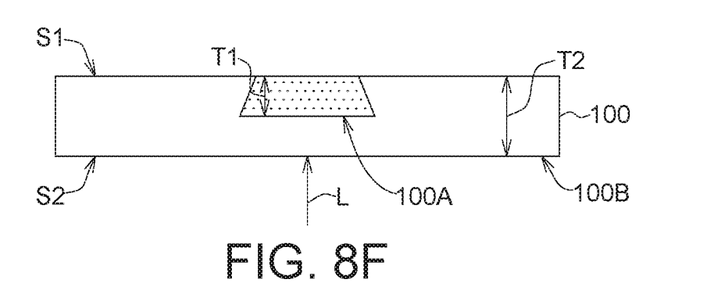

As indicated in FIG. 8E-FIG. 8F, when the thickness T1 of the first region 100A of the dielectric substrate 100 is set to be smaller than the thickness T2 of the dielectric substrate 100 and the cross-sectional shape of the first region 100A is a trapezoid, during the formation of the first region 100A, the applying direction of the laser L is related to the shape of the trapezoid.

Figure 8G:
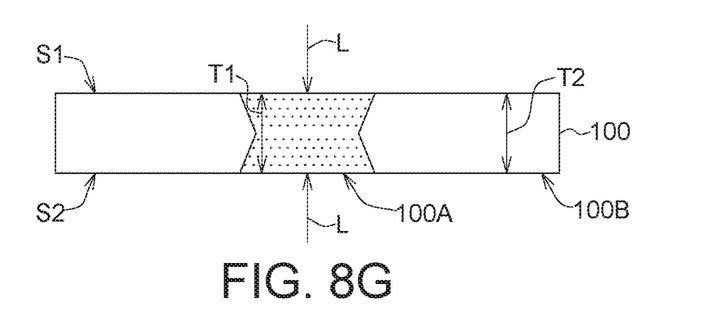

As indicated in FIG. 8E, when the laser L is applied from the first side S1 of the dielectric substrate 100, the first side S1 faces upwards, and the length of the bottom edge is smaller than the length of the top edge of the trapezoid. As indicated in FIG. 8F, when the laser L is applied from the second side S2 of the dielectric substrate 100, the first side S1 faces upwards, and the length of the bottom edge is larger than the length of the top edge of the trapezoid. As indicated in FIG. 8G, when the laser L is applied from both the first side S1 of the dielectric substrate 100 and the second side S2 of the dielectric substrate 100, the first side S1 faces upwards, and the cross-sectional shape of the first region 100A of the dielectric substrate 100 is formed of two trapezoids. Of the trapezoid closer to the first side S1, the length of the bottom edge is smaller than the length of the top edge. Of the trapezoid farther away from the first side S1, the length of the bottom edge is larger than the length of the top edge.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A high-frequency electronic device, comprising:
   a dielectric substrate having a first side, a second side opposite to the first side, a first region, and a second region adjacent to the first region, wherein the first region and the second region have different etching rates with respect to an etching solution;
   a first patterned metal layer disposed on the first side of the dielectric substrate and corresponding to the first region; and
   a second patterned metal layer disposed on the first side or the second side of the dielectric substrate, wherein a lateral side of the first patterned metal layer is separated from a lateral side of the first region by a second distance, and the second distance is in a range from 2 to 6 times a width W of the first patterned metal layer.

2. The high-frequency electronic device according to claim 1, wherein a first projection of the first patterned metal layer on the dielectric substrate overlaps the first region, and the first projection does not overlap the second region.

3. The high-frequency electronic device according to claim 1, wherein the first region has a first etching rate with respect to the etching solution, the second region has a second etching rate with respect to the etching solution, and the first etching rate is smaller than the second etching rate.

4. The high-frequency electronic device according to claim 1, wherein a second projection of the second patterned metal layer on the dielectric substrate overlaps the first region.

5. The high-frequency electronic device according to claim 4, wherein the second projection of the second patterned metal layer on the dielectric substrate further overlaps the second region.

6. The high-frequency electronic device according to claim 1, wherein the second patterned metal layer is disposed on the second side of the dielectric substrate, the second patterned metal layer is separated from the first patterned metal layer by a first distance, and the second distance is in a range from 2 to 6 times the first distance.

7. The high-frequency electronic device according to claim 1, wherein the first patterned metal layer and the second patterned metal layer are disposed on the first side of the dielectric substrate and are separated by an interval S, the first region has a width W1, and the width W, the width W1 and the interval S satisfy the following equation:

2W+2S<W1<13W+2S.

8. The high-frequency electronic device according to claim 1, wherein a thickness of the first region is smaller than a thickness of the dielectric substrate.

9. The high-frequency electronic device according to claim 1, wherein a thickness of the first region is equal to a thickness of the dielectric substrate.

10. The high-frequency electronic device according to claim 1, wherein the width W of the first patterned metal layer is equal to a width of the first region of the dielectric substrate.

11. The high-frequency electronic device according to claim 1, wherein a cross-sectional shape of the first region is a square.

12. The high-frequency electronic device according to claim 1, wherein a cross-sectional shape of the first region is a trapezoid.

13. A high-frequency electronic device, comprising:

a dielectric substrate having a first side, a second side opposite to the first side, a first region, and a second region adjacent to the first region, wherein the first region and the second region have different etching rates with respect to an etching solution;

a first patterned metal layer disposed on the first side of the dielectric substrate and corresponding to the first region; and a second patterned metal layer, wherein the first patterned metal layer is interposed between the second patterned metal layer and the dielectric substrate, the first patterned metal layer is separated from the second patterned metal layer by a first distance, a lateral side of the first patterned metal layer is separated from a lateral side of the first region by a second distance, and the second distance is in a range from 2 to 6 times the first distance.

14. The high-frequency electronic device according to claim 13, wherein a first projection of the first patterned metal layer on the dielectric substrate overlaps the first region, and the first projection does not overlap the second region.

15. The high-frequency electronic device according to claim 13, wherein a second projection of the second patterned metal layer on the dielectric substrate overlaps the first region.

16. The high-frequency electronic device according to claim 13, wherein the first patterned metal layer and the second patterned metal layer are disposed on the first side of the dielectric substrate and are separated by an interval S, the first patterned metal layer has a width W, the first region has a width W1, and the width W, the width W1 and the interval S satisfy the following equation:

2W+2S<W1<13W+2S.

17. The high-frequency electronic device according to claim 13, wherein a thickness of the first region is smaller than or equal to a thickness of the dielectric substrate.

18. The high-frequency electronic device according to claim 13, wherein a width of the first patterned metal layer is equal to a width of the first region of the dielectric substrate.

* * * * *